(12) United States Patent
Glassie

(10) Patent No.: US 6,831,873 B1
(45) Date of Patent: Dec. 14, 2004

(54) INDEPENDENT IN-LINE SDRAM CONTROL

(75) Inventor: Neil Glassie, Lewisville, TX (US)

(73) Assignee: Alcatel, Paris (FR)

( * ) Notice: Subject to any disclaimer, the term of this patent is extended or adjusted under 35 U.S.C. 154(b) by 37 days.

(21) Appl. No.: 10/241,967

(22) Filed: Sep. 12, 2002

(51) Int. Cl.$^7$ .................................. G11C 8/00

(52) U.S. Cl. ............. 365/233; 365/230.01; 365/230.03; 365/230.08

(58) Field of Search ........................... 365/233, 230.01, 365/230.03, 230.08

(56) References Cited

U.S. PATENT DOCUMENTS

| | | | |
|---|---|---|---|
| 6,510,099 B1 * | 1/2003 | Wilcox et al. | 365/230.06 |
| 2002/0085432 A1 * | 7/2002 | Weber et al. | 365/200 |
| 2003/0151939 A1 * | 8/2003 | LaBerge | 365/63 |

* cited by examiner

Primary Examiner—Richard Elms
Assistant Examiner—Pho M. Luu
(74) Attorney, Agent, or Firm—Craig A. Hoersten; V. Lawrence Sewell (57) ABSTRACT

A device and method for independent control of SDRAM memory in an SDRAM memory module. The device includes an in-line controller (ILC) coupled to receive indications of memory controller interrupt events. The ILC is coupled with the SDRAM memory, possibly through a registered buffer, in such a way that when an indication of a memory controller interrupt event is received, the ILC issues appropriate instructions to the SDRAM memory and prevents any spurious memory controller signals from being transmitted along the control bus. A memory module incorporating an ILC in communication with a memory controller and an SDRAM memory device or bank of such devices. Ultimately, a number of ILCs may be used, each controlling an individual SDRAM bank or discreet memory device. A method of protecting information stored on an SDRAM memory device, including the steps of providing an ILC in a SDRAM memory module receiving an indication of an interrupt event, interrupting the signals from the memory controller, if any, and providing instructions to the SDRAM memory device.

24 Claims, 11 Drawing Sheets

INDEPENDENT IN-LINE SDRAM CONTROL

The present invention relates generally to the design of memory modules for computing devices, and more specifically to an in-line controller (ILC) providing independent interrupt support, for example in preventing unnecessary data loss in synchronous dynamic random access memories (SDRAMs) during an interruption in control signals. The ILC can also be used, in some applications, to reduce power consumption and to expand memory capacity.

BACKGROUND OF THE INVENTION

Virtually every modern computing device incorporates at least one, and typically several memory devices for storing instructions and data. The computing device may be a personal computer (PC), a dedicated-use device such as a telecommunications switch, or a mobile device such as a web-enabled wireless personal digital assistant (PDA). These are only examples, of course, many other computing devices are available. Each will usually include a read only memory (ROM) for storing instructions needed for starting up the device when power is first supplied. As its name implies, a ROM is typically not written to—although programmable variations of the basic ROM are available. ROM memory is non-volatile, meaning that the information stored on it is not lost when the power is turned off. It is precisely this non-volatile quality, of course, that permits the ROM to reliably store the device's start-up instructions.

Because the ROM cannot ordinarily be written to, or at least easily reprogrammed, it is of little use for storage of information that frequently changes. (There is also typically a limit to the number of times that a programmable ROM can be reliably re-programmed.) Frequently changing information includes, for example, data and program instructions associated with word processing documents, spreadsheets, routing tables, retrieved web pages. For long-term storage of such items, a hard drive, floppy disc, tape, or even a compact disc may be used. Such devices provide satisfactory means for long-term (and non-volatile) storage, but require relatively significant time for read and write operations, and are therefore less than satisfactory for currently-running applications, especially those that require numerous memory-access operations such as games.

One of the factors that makes disc or tape-drive memories relatively slow, of course, is the need to move physical media during the read and write processes. Much faster therefore are solid state memory devices. The previously-discussed ROM is one example of such devices. For rapid access to stored data, another solid-state memory device called random access memory (RAM) is often used. These devices use an organized plurality of transistors, and sometimes capacitors in order to store individual bits of data. A supply of electricity is necessary in order for this storage to be maintained, and therefore such devices are said to be volatile in nature. That is, when electrical power is lost, the stored information is lost as well. While this can certainly be a disadvantage under some circumstances, the speed of access associated with RAM devices and their relatively inexpensive cost of construction make them ideal for storing data related to running applications. The basic operation of these RAM devices will now be covered as part of the background of the invention.

As mentioned above, the RAM device is made up of a large number of individual electrical components. The components used may vary to some extent, but in general there are two basic types of RAM. The first uses an array of independently accessible transistors, and the electrical state of each individual set of transistors making up a memory location determines its contents. This type of RAM is called "static RAM" (SRAM) because the contents of each memory location remains unchanged as long as power is applied, or until it is rewritten. The second type of RAM uses a series of transistors, each having an associated capacitor. Each such individual pair of components forms a separate memory location, and has an associated address assigned as being in a particular row and column of an array. The state of the capacitor as containing a charge (or not) indicates the state (one or zero) of the particular memory location. The transistors are used to control application of electrical current to the capacitor. Capacitors are subject to lose their charge over time, however, and so any capacitor whose assigned state requires that it store an electrical charge must be periodically "refreshed" so that it does not revert to its uncharged state. Because the capacitors in this type of RAM must be periodically refreshed, it is referred to as a dynamic RAM (DRAM). (As will be seen below, the present invention is of particular advantage when used with a DRAM.) Both types of RAM devices perform essentially the same function in slightly different ways. Capacitors being smaller and less expensive to manufacture than transistors, however, DRAM devices are often more desirable despite the need for a refresh cycle.

There are several types of DRAM devices. In general, the different types represent attempts to make the memory device faster in operation through some design enhancement. One such type is the synchronous DRAM (SDRAM), which synchronizes its read and write operations according to the cycles of the system clock, allowing much quicker operation. SDRAMs are becoming increasingly popular for this reason and are used in a great many devices. Despite the increase in operating speed, however, the SDRAMs still require a periodic refresh cycle in order to maintain the integrity of the stored data.

Figure 1A:
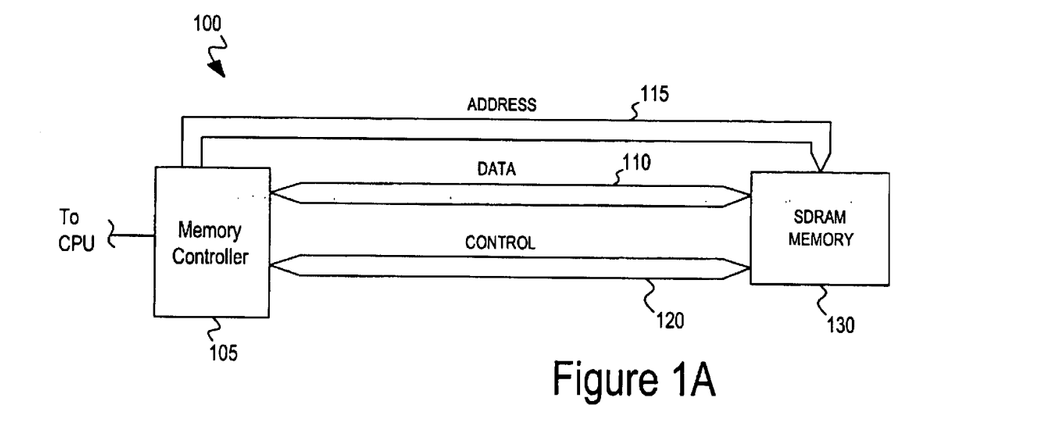
FIG. 1A is a simplified block diagram illustrating a typical memory module, including a memory controller and SDRAM memory connected by a number of busses.

FIG. 1A shows a simplified SDRAM memory module. The memory module 100, a term used herein for convenience, will generally be said to include at least a memory controller 105 connected to an actual SDRAM by a data bus 110 for transporting data back and forth, address bus 110 for specifying the address to read or write the data from and control bus 120 for the transmission of control signals. The memory controller 105 is usually connected directly to the computing devices central processor (not shown). In an alternate embodiment, the memory controller 105 may actually be manufactured as part of the central processing unit (CPU) itself.

Figure 1B:
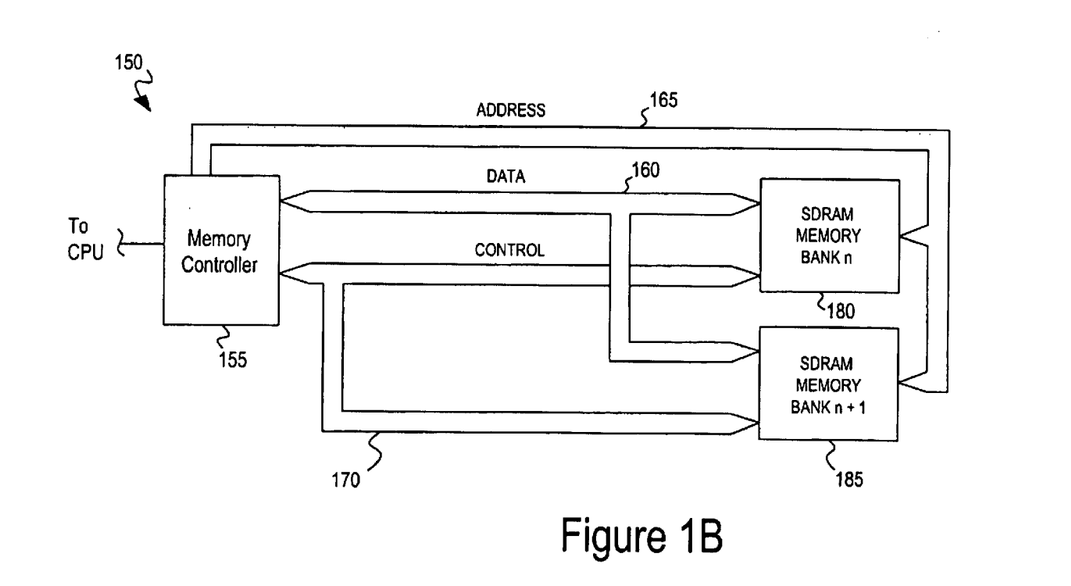
FIG. 1B is a simplified block diagram illustrating the configuration of a typical memory module utilizing a number of SDRAM memory banks controlled by single memory controller.

FIG. 1B is a simplified block diagram illustrating a basic memory module according to an alternate design, one that uses multiple memory banks. According to this configuration, memory module 150 includes memory controller 155, which controls SDRAM memory banks 180 and 185 through control bus 170. Control bus 170, as well as data bus 160 and address bus 165 are of course coupled with the memory controller 155 itself and with both SDRAM memory banks. Note that although two memory banks are shown, there could be many.

Generally speaking, memory controllers such as memory controller 105 in FIG. 1A and memory controller 155 in FIG. 1B are microchips designed and sold specifically for this purpose. They often have other functions as well, but their function with regard to data and instruction storage is to receive instructions from the computing device's central processing unit and to direct which information is to be stored in, or retrieved from memory. Likewise, SDRAM devices are often designed as individual memory chips or portions of a chip set. The use of multiple banks of SDRAM, such as is illustrated in FIG. 1B, allows a designer/manufacturer to increase memory size simply by adding another stock SDRAM device, rather than having to design and build one that is uniquely suitable for the application at hand. The number of SDRAM memory banks that can be employed is often limited by the ability of the memory controller to separately address each available memory location.

Unfortunately, where the memory controller does perform other functions, its operation may be interrupted by the need for a reset related to one of those other functions. Even where no other function is being utilized, any reset or interruption in the refresh control signals generated by the memory controller will result in a loss of the data and instructions stored in the SDRAM, whether or not the system power has actually failed or not. Of great advantage in such instances would be a device or method of preserving the information stored on the SDRAM or multiple SDRAM banks even in the event that the main memory controller is unable to send appropriate control signals to direct the SDRAM memory to continue its refresh cycle. The present invention provides just such a solution.

SUMMARY OF THE INVENTION

The present invention is directed to an independent, in-line controller (ILC) for a memory module. In one aspect, the invention is a memory module including synchronous dynamic random access memory (SDRAM) controlled by a memory controller through a control bus, the memory module also including an address bus for transmitting a read or write address to the SDRAM, and a data bus for carrying information back and forth between the SDRAM and the memory controller. The memory module further includes an ILC coupled to the control bus in such a way that when it receives an indication of an interruption event, it disconnects the memory bus at an appropriate time, disallowing any control signals from the memory controller to pass to the SDRAM, and provides instead an interim-state instruction to the SDRAM. In most cases, this will be an instruction to the SDRAM to set itself into a low-power self-refresh mode, where it will maintain the data even though the memory controller is not functioning properly. Where the control bus connects to several banks of SDRAM memory, the number of ILCs may vary accordingly. The memory module may further include a detector for detecting when an interruption event is about to occur, and a timer for timing the length of an interruption event or the delay necessary when transferring control between the memory controller and the ILC.

It is an object of the invention to provide a device and method for use in maintaining information stored in an SDRAM by detecting an interruption event and replacing the control signals from the memory controller with an instruction to have the SDRAM to place itself in low-power self-refresh mode or to take some other appropriate action. It is another object of the invention to provide a device for expanding memory beyond the normal range of the memory controller's capability. It is another object of the invention to provide a device for reducing the power consumption of a memory module by selectively shutting down various portions of a memory.

BRIEF DESCRIPTION OF THE DRAWINGS

For a more complete understanding of the present invention, and the advantages thereof, reference is made to the following drawings in the detailed description below.

DETAILED DESCRIPTION

Figure 2A:
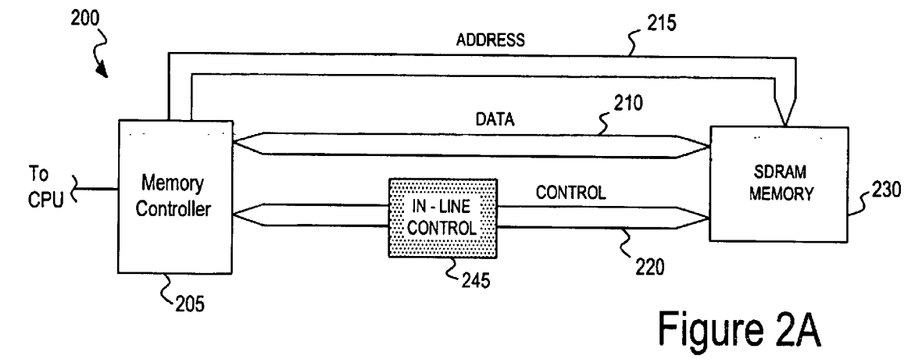
FIG. 2A is a simplified block diagram showing a memory module having an ILC according to an embodiment of the present invention.

The present invention is directed to an independent in-line controller (ILC) for controlling memory systems, for example SDRAM memory systems, as described more completely below. FIG. 2A is a simplified block diagram showing a memory module having an ILC according to an embodiment of the present invention. The memory module 200 is similar in some ways to the unmodified memory module 100 illustrated in FIG. 1A, and so corresponding components are numbered analogously though not identically. Note that where the CPU or central processor coupled to the memory controller is mentioned, this is only for reference and no particular controller is required. In memory module 200 the control bus 220 between the memory controller 205 and the SDRAM 230 is selectively interruptible by ILC 245. In one embodiment, when the ILC 245 detects a loss of the refresh control signal from the memory controller 205, it instructs the SDRAM memory 230 to enter low-power self-refresh mode. In this state, the information stored in the SDRAM will be preserved, although read and write operations will not be enabled. Preferably, the ILC 245 also prevents or interrupts any control signals from the memory controller 205 until it determines that the memory controller 205 is again functioning normally. In this embodiment, once normal control signals are being generated by memory controller 205, the ILC selects an appropriate time to allow the SDRAM to enter full operational mode and resume receiving control instructions from memory controller 205. Once this transfer of control back to memory controller 205 has been effected, no further control signals are generated by ILC 245 until the next event.

Figure 2B:
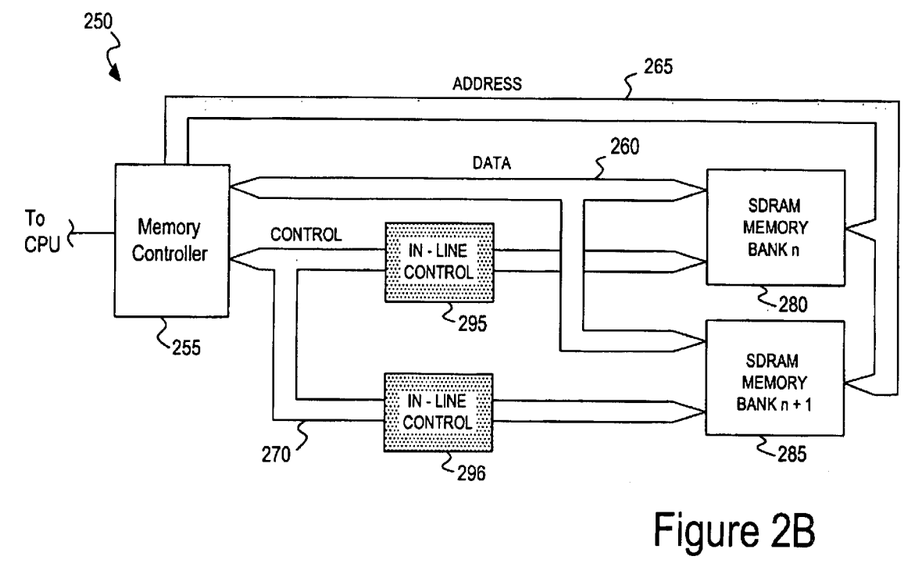
FIG. 2B is a simplified block diagram illustrating the memory module architecture where a number of memory banks are employed and each receives control signals from the control bus.

FIG. 2B is a simplified block diagram illustrating the memory module 250 architecture where a number of SDRAM memory banks are employed and each receives control signals via the control bus 270. In this embodiment, in-line control is achieved by using ILC 295 and ILC 296, which are each independently operable to interrupt control signals from memory controller 255 to SDRAM memory bank 280 and memory bank 285, respectfully, in a fashion substantially as described above with regard to the single memory bank system. Alternately, of course, a system of multiple memory banks could be controlled by a single ILC, in which case its architecture may more closely resemble that of FIG. 2A.

Figure 3:
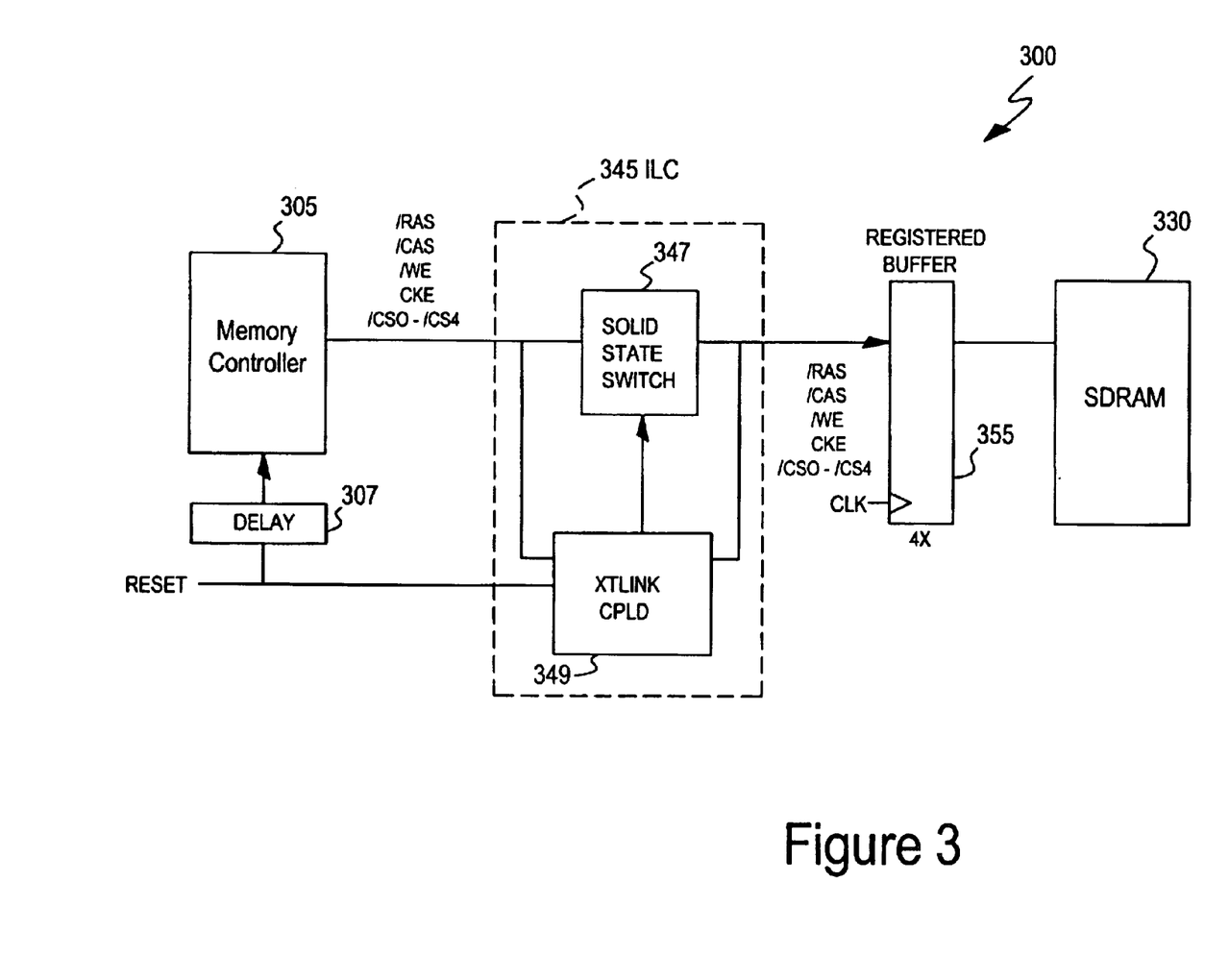
FIG. 3 is a memory module for controlling an SDRAM memory device, including and independent in-line controller (ILC) according to an embodiment of the present invention.

FIG. 3 is a block diagram illustrating in more detail the interconnection of the various components in memory module 300 according to one embodiment of the present invention. Memory module 300 includes memory controller 305, which is in turn coupled to the computing device's microprocessor (not shown). Memory controller 305, among other things, generates control signals such as row access strobe (/RAS), column access strobe (/CAS), write enable (/WE), clock enable (CKE), and chip select (/CS). (Note that for simplicity the control bus is here illustrated as a line and the address and data busses have been omitted.) These control signals pass directly through ILC 345 to registered buffer 355 in the ordinary course of operation, where they are buffered until an appropriate clock signal is received, at which point they are provided to the SDRAM memory device 330 itself.

In the embodiment of FIG. 3, ILC 345 includes a solid state switch 347, which unless otherwise instructed allows the control signals to pass from memory controller 305 to registered buffer 355. Such instructions, in this embodiment, would come from the complex programmable logic device (CPLD) 349 upon the detection of a memory-controller interrupt event. A "memory-controller interrupt event" is an occurrence that triggers operation of the ILC, for example a memory-controller reset or a failure to timely initiate a refresh cycle. These interrupt events do not have to be unintended, however, and may also result from intentionally-created conditions. In the embodiment of FIG. 3, CPLD 349 receives the control signals generated by memory controller 305. It also receives, in this embodiment, any reset signal that will be provided to memory controller 305. The CPLD 349, therefore, may detect an interrupt event in one of two possible ways. First, it may be configured to monitor the control signals for memory controller 305, and in particular, the signals associated with the generating a refresh of the SDRAM memory in order to prevent loss of information stored. Should the refresh cycle not be directed as expected, or if some other unexpected event occurs, the CPLD can initiate appropriate action. Second, the CPLD 349 may receive an external indication (that is, not from the memory controller itself) that an interrupt event is occurring or is about to occur. Referring to FIG. 3, the reset signal, which may for example come from the processor of the computing device, or may be user generated, is provided to the memory controller through a delay buffer 307 at the same time that it is provided to CPLD 349. The delay in the reset signal induced by delay buffer 307, however, enables CPLD 349 to direct solid state switch 349 to interrupt control signals from the memory controller and also to allow CPLD to begin generating control signals of its own.

In one embodiment, the action initiated by CPLD 349 upon the detection of an interrupt event, is simply to transmit at an appropriate time a control signal directing the SDRAM to enter a low-power self-refresh mode. In his way, when a reset signal is generated that will cause the memory controller to temporally cease sending control signals, including refresh control signals to SDRAM 330, CPLD 349 will direct the SDRAM to go into a low-power self-refresh mode. In this mode, read and write operations may not occur, but the information already stored in the SDRAM is maintained indefinitely.

Upon detecting that the memory controller 305 is again generating appropriate control signals, or alternately upon detecting a return to normal operations signal from an external source, CPLD will generate a control signal allowing the SDRAM to return to its normal operating state. This will involve both sending appropriate instructions to the SDRAM and also directing solid state switch 347 to allow control signals from the memory controller 305 to pass through to the registered buffer 355.

Figure 4:
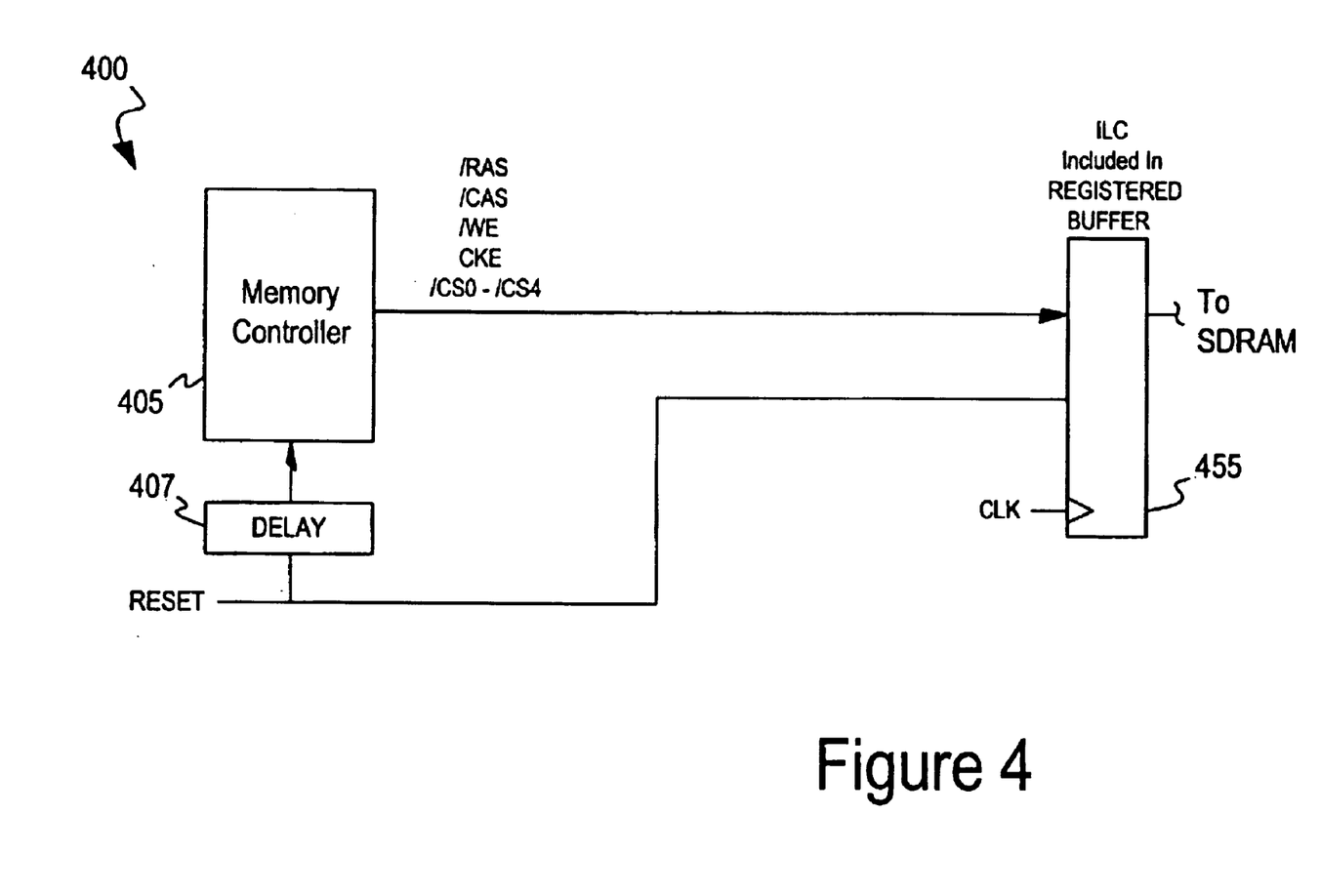
FIG. 4 is a simplified block diagram illustrating the relationship of the various components of a memory module having an ILC included in a registered buffer associated with the SDRAM according to another embodiment of the present invention.

FIG. 4 is a simplified block simplified block diagram illustrating the relationship of the various components of a memory module 400 having an ILC (not separately illustrated) included in a registered buffer 455 associated with the SDRAM (not shown) according to another embodiment of the present invention. In the embodiment of FIG. 4, the ILC is actually incorporated into the registered buffer 455, which receives signals directly from memory controller 405 and provides those signals to the SDRAM. As with the embodiment of FIG. 3, the reset signal, which represents an external signal indicating an impending interrupt event, is provided to registered buffer 455, including its integrated ILC, and also provided to a delay buffer 407 for provision at a slightly later time to memory controller 405. Note that although the example of an external reset signal is used, the integrated ILC could also detect an interrupt event by monitoring the control signals being received (or lack thereof) from memory controller 405. In addition to a reset situation, other types of events may also trigger action by the ILC. (In this embodiment, the ILC is included in the registered buffer 455, and is therefore not separately shown or enumerated.) Note that in either embodiment (FIG. 3 or FIG. 4) the system clock signal may be provided to the ILC as well as to the registered buffer.

Figure 5:
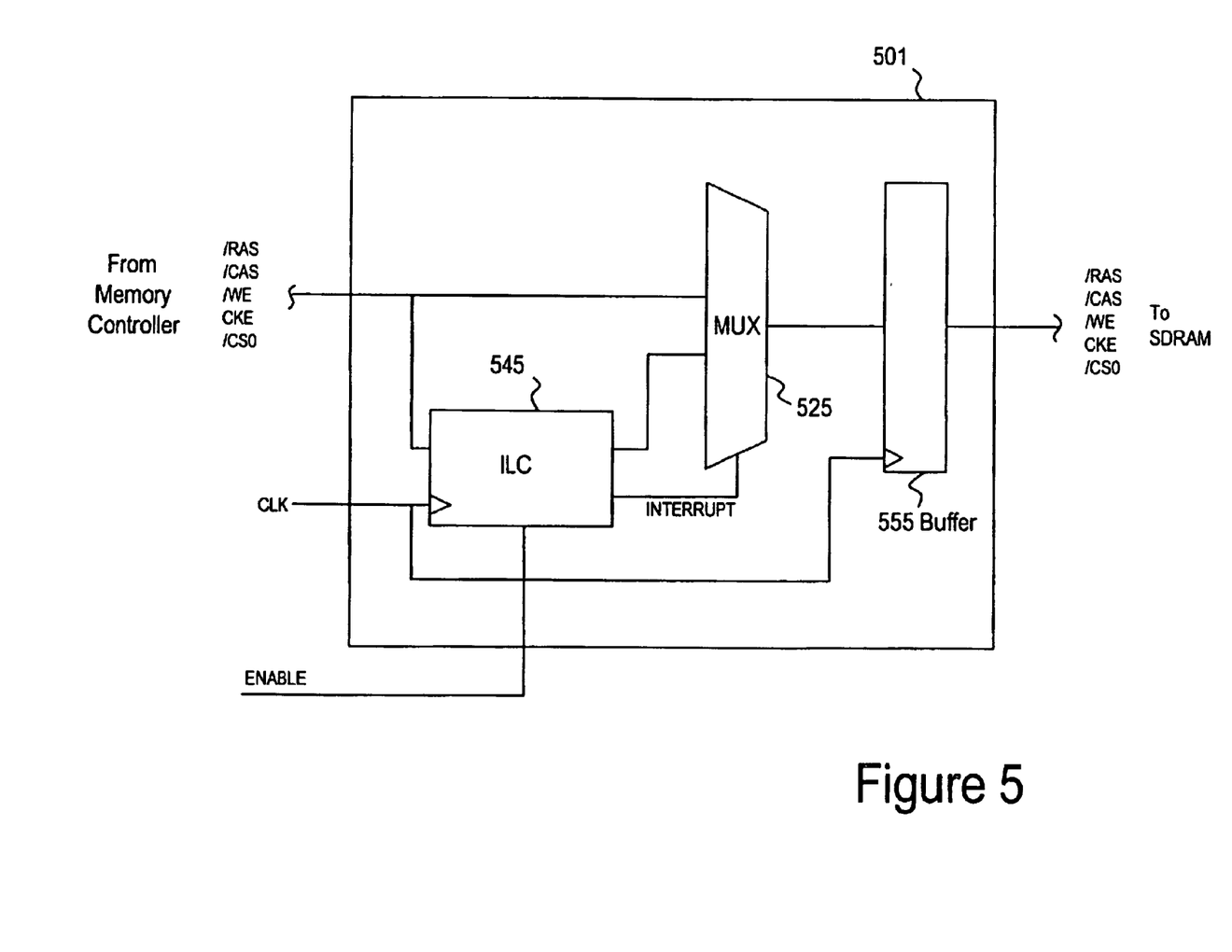
FIG. 5 is a block diagram illustrating the interconnection of control lines for implementing an ILC for SDRAM control according to an embodiment of the present invention.

FIG. 5 is a block diagram illustrating the interconnection of control lines for implementing an ILC for SDRAM control according to a single-chip embodiment of the present invention. In this embodiment, chip 501 receives control signals from the memory controller (not shown) and ultimately provides them to the SDRAM (also not shown) subject to interruption by the ILC 545. In the embodiment of FIG. 5, a multiplexer (MUX) 525 is provided to received the control signals from the memory controller and, when appropriate, from the ILC. In addition to the control signals from the ILC, the MUX also receives an interrupt signal to direct which of the two sets of control signals it receives should be provided to the register 555 and eventually to the SDRAM. In the embodiment of FIG. 5, a clock (CLK) signal is provided both to the registered buffer 555 and to the ILC. Also provided to the ILC 545 is an ENABLE signal, the significance of which will now be explained.

One function of the ILC 545 is to provide an instruction to the SDRAM to go low-power self-refresh mode upon the occurrence of an interrupt event. As mentioned above, this interrupt event may detected by monitoring the control signals from the memory controller, or by an externally received signal. In either case, the ILC 545 may detect an interrupt event during a power-up of the device, remembering that the SDRAM is volatile memory and therefore empty when the device power is actually turned off. No information is being retained there. The enabled signal simply prevents the ILC 545 from perceiving an interrupt event when the power is turned on and the SDRAM and the memory controller are being initialized.

Figure 6:
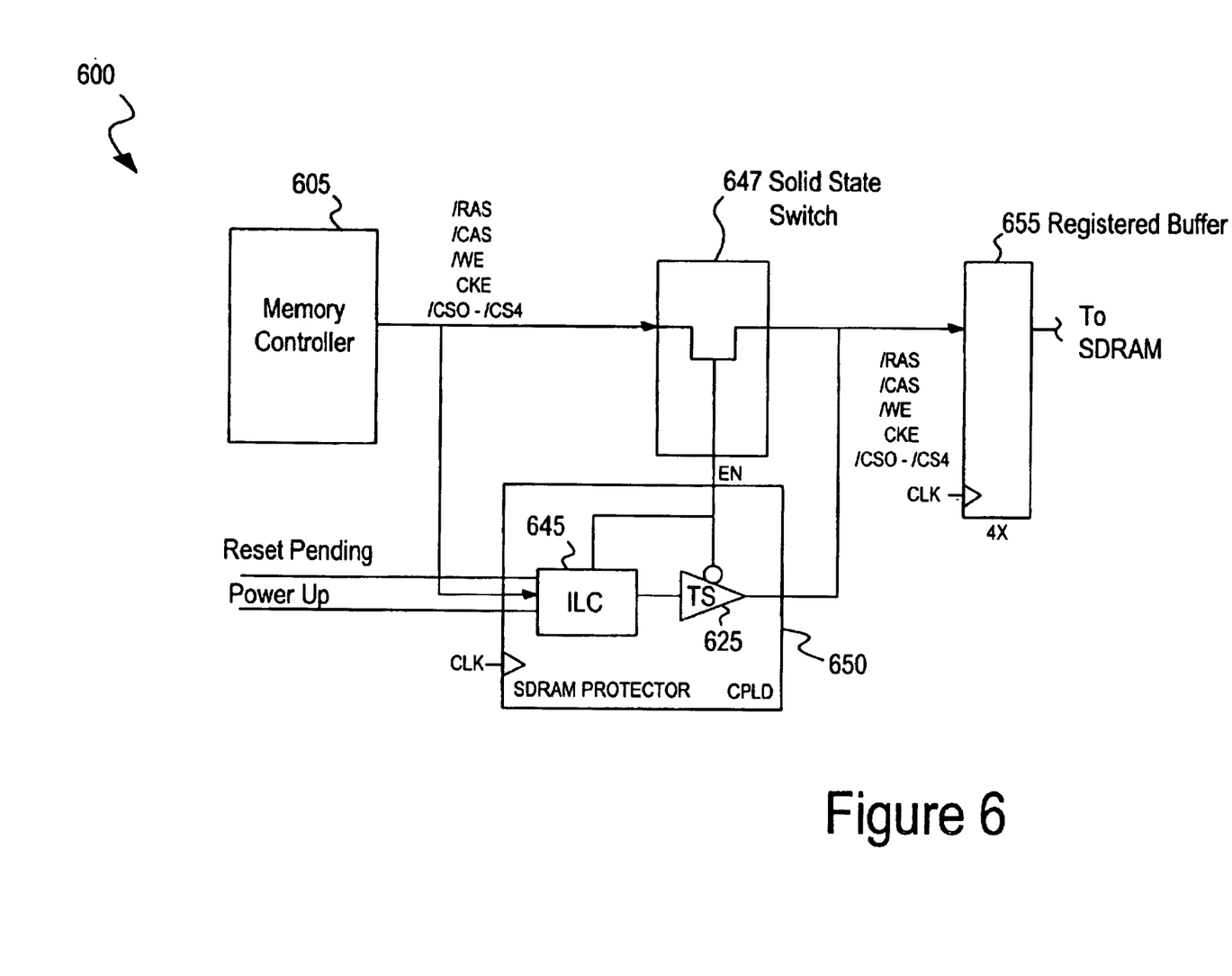
FIG. 6 is a block diagram illustrating the interconnection of control lines for implementing an ILC for SDRAM control according to another embodiment of the present invention.

FIG. 6 is a block diagram illustrating a memory module 600 for implementing an ILC 645 for SDRAM control according to another embodiment of the present invention. In the embodiment of FIG. 6, memory control signals are generated by memory controller 605 and are passed to the registered buffer 655 through solid state switch 647. ILC 645 implemented on a CPLD 650 also receives the control signals from memory controller 65. Also implemented on CPLD 650 is tri-state MUX 625. When ILC 645 receives a reset pending signal, indicating that an interrupt event is imminent, it monitors the control signals from memory controller 605 for an appropriate time, then at that appropriate time causes solid state switch 647 to interrupt the flow of control signals from the controller. Tri-state MUX 625 is then enabled to allow a control signal from the ILC 645 to pass through to the registered buffer 655. Again, this will generally be a instruction to the SDRAM to set itself into low-power self-refresh mode. This state will again until the reset pending signal is eliminated, or until the memory controller resumes sending out normal operational control signals. The power up signal supplied to ILC 645 on CPLD 650 disenables the ILC from interrupting memory controller signals or sending out its own memory controller signals during the device's power-up operation.

Figure 7:
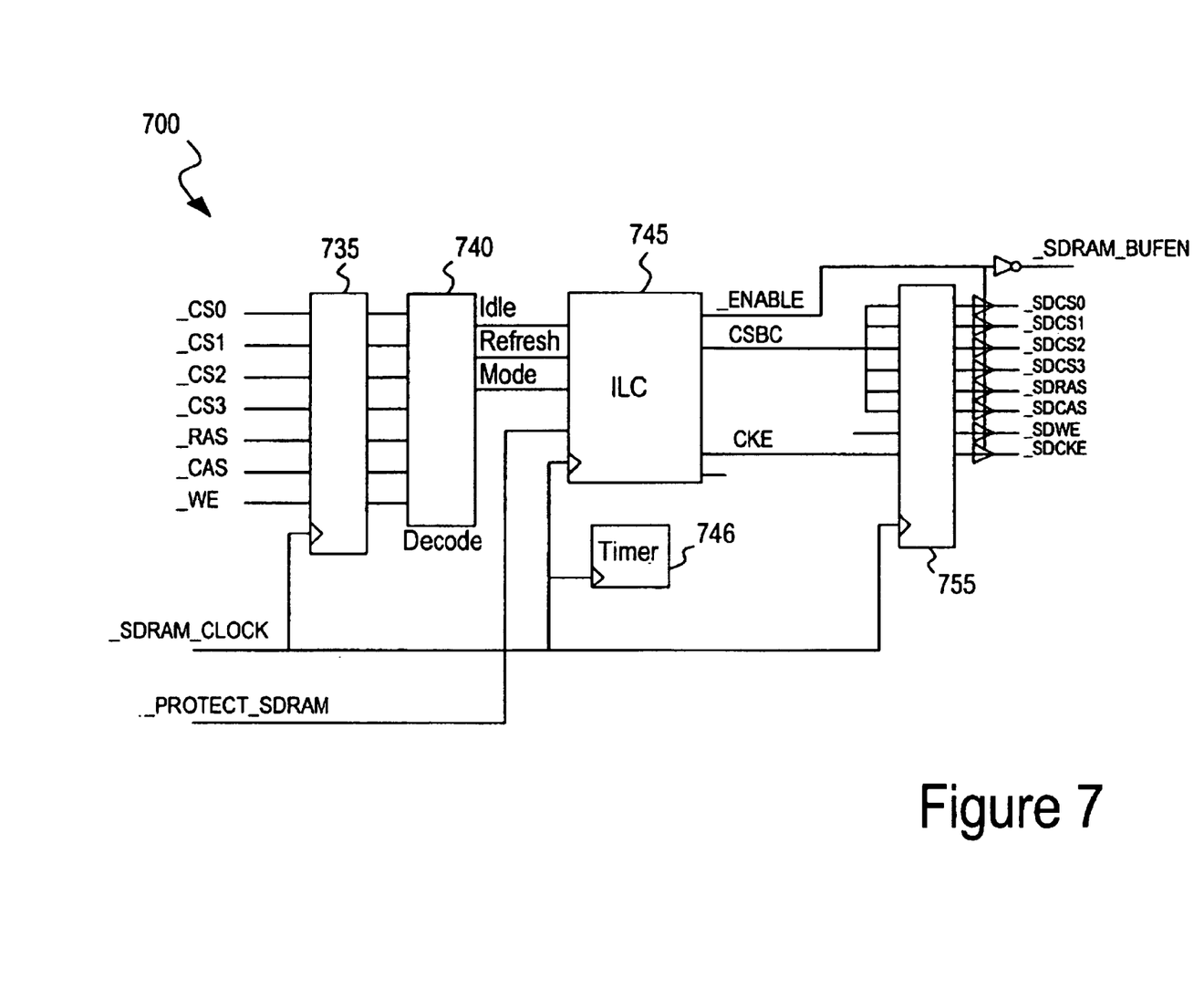
FIG. 7 is a block diagram illustrating an exemplary interconnection of control lines for implementing an ILC for SDRAM control according to another embodiment of the present invention.

FIG. 7 is a block diagram illustrating memory module 700 for implementing an ILC 745 for SDRAM control according to another embodiment of the present invention. In this illustration, the control signals are shown entering buffer 735 where they are buffered until clocked into decoder 740. ILC 745 interrupts the signals received from decoder 740 in order to monitor whether the memory controller (not shown in FIG. 7) is operating normally. If it is not, or if a_PROTECT_SDRAM signal is received, then it may interrupt the signals from the memory controller by switching the enable signal that permits the control signals from registered buffer 755 to be presented to the SDRAM (not shown). When ILC 745 receives a refresh indication from decoder 740, it uses optional timer 746 in order to determine when the SDRAM should be refreshed and then its control turned or returned to the memory controller itself.

Figure 8:
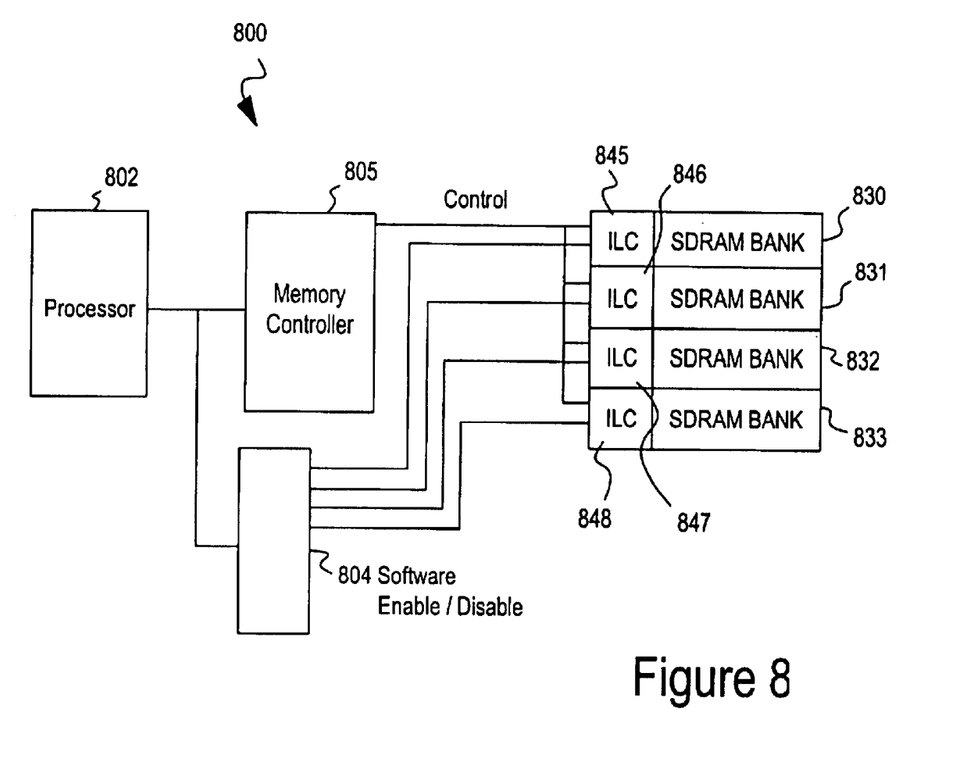
FIG. 8 is a simplified block diagram illustrating a memory module including a number of SDRAM banks controlled by a single memory controller, each SDRAM ram bank having it's own ILC according to another embodiment of the present invention.

FIG. 8 is a simplified block diagram illustrating a memory module 800 including a number of SDRAM banks controlled by a single memory controller, each SDRAM bank having it's own ILC according to another embodiment of the present invention. The embodiment of FIG. 8 shows the use of four ILCs, enumerated 845 through 847, each controlling a separate SDRAM bank 830 through 833. As with previous embodiments of the present invention, each ILC receives control signals from the memory controller 805 which control signals it allows to pass to the SDRAM bank unless and until an interrupt event occurs. Although as discussed above, this interrupt event may be a loss of refresh signal or warning of impending reset, in this embodiment, a separate software enable/disable is used to supply a signal indicating to each of the separate ILCs when to interrupt control signals to its associated SDRAM bank and set it into, for example, low-power self-refresh mode. The software enable/disable 804 signal generator is shown here coupled with the processor 802 as is the memory controller 805 itself. The software enable/disable 804 could of course be integrated with the processor 802 or some other device as well. In the embodiment of FIG. 8, memory controller sends out control signals that are selectively applied to an SDRAM bank through the intervention of the ILCs.

For example, the software enable/disable generator 804 may provide an enable signal to ILCs 845, 846, and 847, causing them to interrupt the control signals received from memory controller 805 and to place their respective memory banks, that is SDRAM bank 830, 831, and 832, respectively, into low-power self-refresh mode. A disable signal to ILC 848, however, allows the control signal from memory 805 to be presented to SDRAM bank 833, which then executes the access or other function it is being instructed to do. In this way, the actually available memory may be expanded beyond the capacity of memory controller 805, which may not realize that it is actually controlling more than one SDRAM bank using identical memory addresses, with the appropriate bank being addressed and the other banks sharing the address being placed in an inactive state. In addition to being used to extend or expand memory capacity for an existing given memory controller, this embodiment may also be used to conserve power by using extra memory banks only when needed, and when they are not needed placing them into a low power-consuming self-refresh mode.

Figure 9:
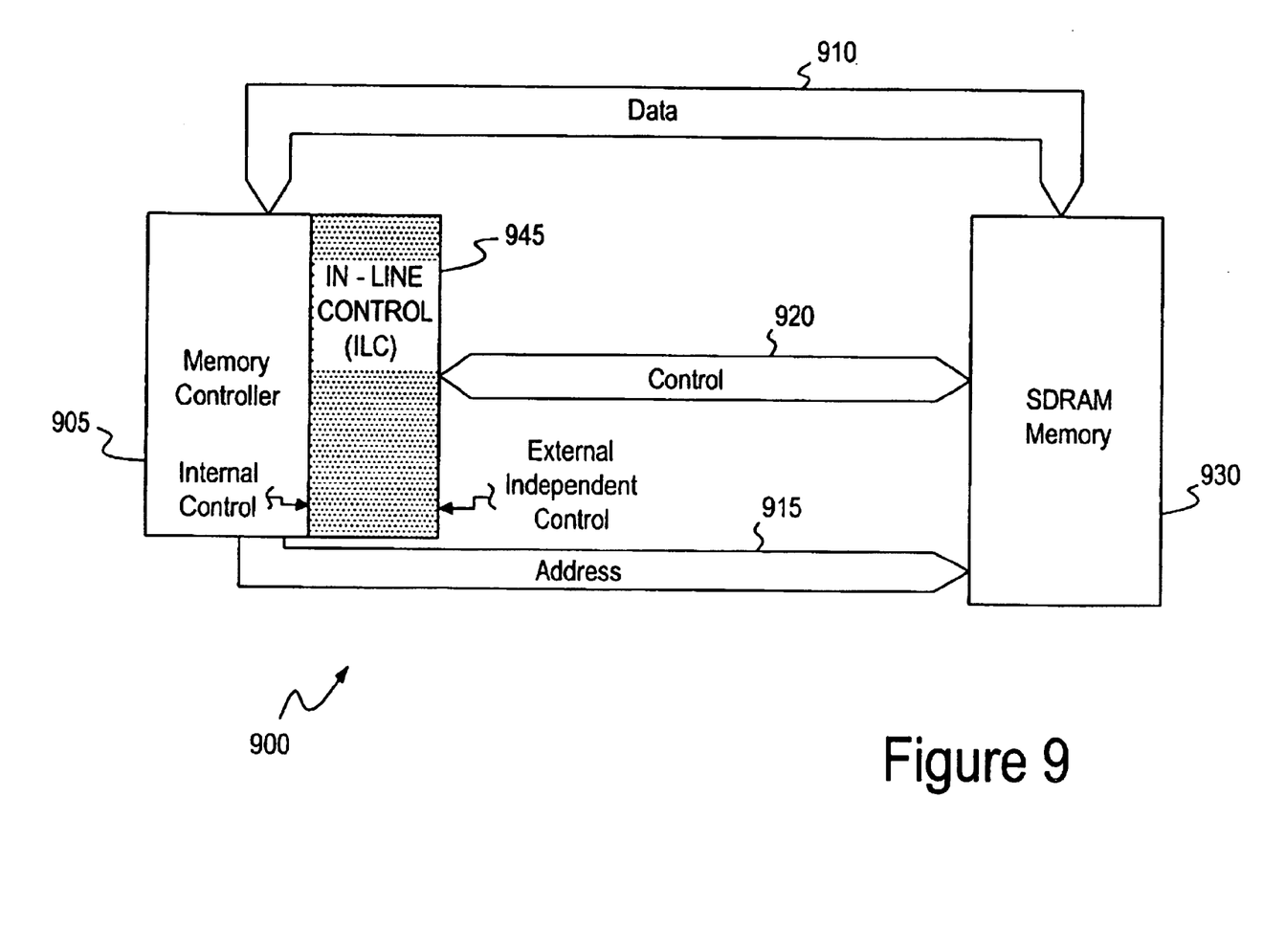
FIG. 9 is a simplified block diagram illustrating how the ILC can be incorporated into the memory controller chip according to another embodiment of the present invention.

FIG. 9 is a simplified block diagram illustrating how the ILC 945 can be incorporated into the memory controller 905 according to another embodiment of the present invention. Note that FIG. 9 is a block diagram, and although ILC 945 is implemented with memory controller 905 on a single chip (or chip set), no specific physical location or configuration is required. As memory controller 905 (internally) generates control signals, the signals are passed through ILC 945 to SDRAM 930 via control bus 910. In the embodiment of FIG. 9, ILC 945 also receives an external signal from which it may detect indications of interrupt events independent of memory controller 905. Data is transmitted to and from memory controller 905 to SDRAM 930 through data bus 910, and memory addresses are relayed via address bus 915. Data and address information does not pass through ILC 945, though in some embodiments this may be desired. For example, ILC could also be configured to monitor or interrupt the data bus prior to assuming control of the SDRAM. Multiple SDRAM banks, although not shown in FIG. 9, could also be managed by ILC 945.

Figure 10:
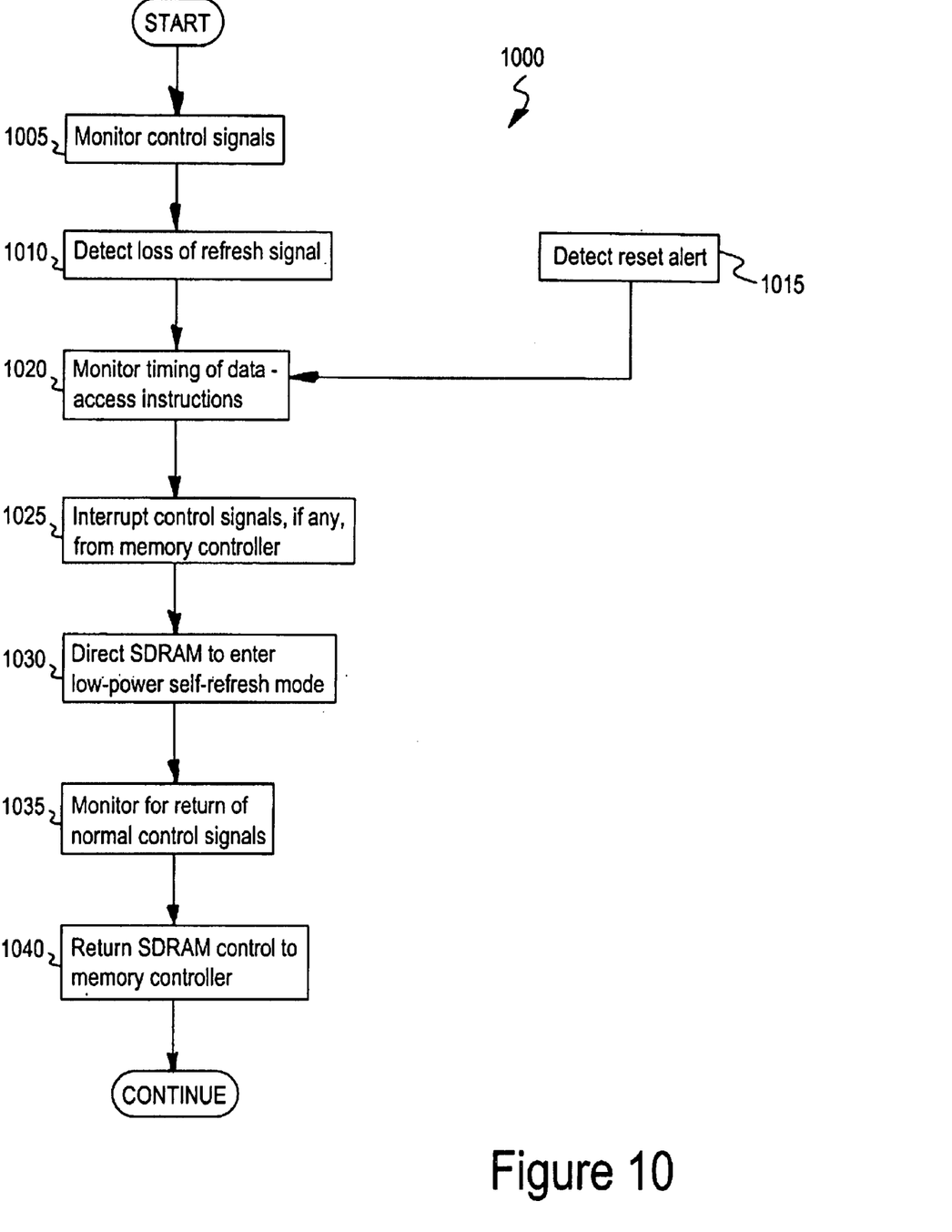
FIG. 10 is a flow diagram illustrating a method of protecting the integrity of information stored on an SDRAM according to an embodiment of the present invention.

FIG. 10 is a flow diagram illustrating a method 1000 of protecting the integrity of information stored on an SDRAM according to an embodiment of the present invention. At START it is assumed that a memory module containing an ILC has been configured, and that the device in which it is operating has been powered up for normal operation. The ILC monitors the control signals from memory controller of the memory module (step 1005). When the ILC detects the loss of an expected refresh signal (step 1010), or receives a signal indicating that a reset event is about to occur in the memory controller (step 1015), it begins to monitor the data storage instructions from the memory controller for an appropriate time to interrupt (step 1020). At the appropriate time it interrupts the control signals, if any, coming from the memory controller (step 1025). At approximately the same time, it also directs the SDRAM to take an appropriate action, which will be usually be to enter low-power self refresh mode (step 1030). At this point, the ILC awaits the receipt of normal control signals from the memory controller, or the disappearance of the reset warning (step 1035). When being thus informed that the interrupt event has been alleviated, the ILC returns control of the SDRAM to the memory controller itself (step 1040). The ILC then remains dormant until another interrupt-event signal is detected.

Figure 11:
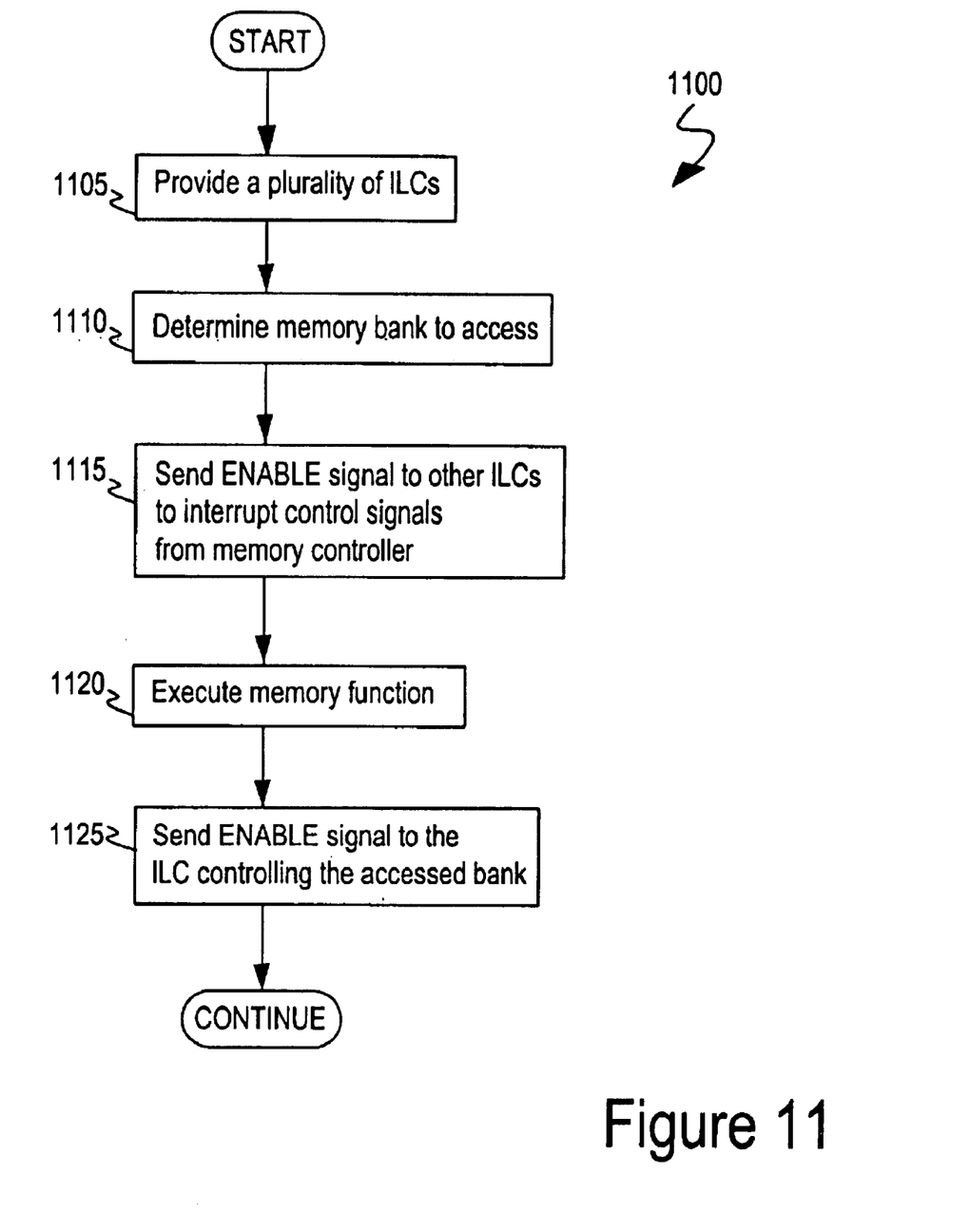
FIG. 11 is a flow diagram illustrating a method of memory expansion in an SDRAM memory module according to another embodiment of the present invention.

FIG. 11 is a flow diagram illustrating a method 1100 of memory expansion in an SDRAM memory module according to another embodiment of the present invention. At START it is assumed that a memory module containing an ILC has been configured, and that the device in which it is operating has been powered up for normal operation. The method 1100 is applicable to a memory module having multiple banks of SDRAM memory (regardless of size), which may be controlled independently according to this embodiment of the present invention. A plurality of ILCs are provided, each ILC controlling one or more of the SDRAM memory banks (step 1105) as desired. Note that a single ILC may control more than one SDRAM memory bank, however, all memory banks controlled by that particular ILC will be enabled or disabled at the same time. Note also that not all SDRAM memory banks need to be associated with an ILC, and in some embodiments of the present invention this will be the case. When an access to memory is required, either the system processor or an independent enable/disable function determines which of the SDRAM memory banks should be addressed for the particular read or write function (step 1110). An enable signal is then sent to the other ILCs (step 1115) causing the ILC receiving the enable signal to disrupt communication from the memory controller and direct their associated SDRAM memory banks to enter low-power self-refresh mode. The memory function may then be executed (step 1120). Any number of memory functions may be executed at this point, including the execution of a refresh cycle for any SDRAM banks that are not currently in low-power self-refresh mode. When the desired memory functions have been executed, the enable/disable function causes an enable signal to be sent to the previously disabled ILC, causing it to interrupt signals from the memory controller and place its associated SDRAM memory bank into low-power self-refresh mode (step 1125). The process then continues with the next memory function requiring execution. As mentioned above, this particular method may be used to expand memory beyond the normal capacity of the memory controller, which can thereby use identical memory addresses to address more than one actual memory location (that is, separate locations in separate SDRAM memory banks). The method 1100 can also be modified to perform a power-conservation function, effectively putting unneeded SDRAM memory bank into a low power-consumption state until they are actually needed. Finally note that the labels "enable" and "disable" may typically be interchanged. In other words, in one embodiment, a disable signal sent to an ILC will simply cause the ILC to remain in an inactive state allowing signals to pass from the memory controller to the SDRAM. The signal could also be called a disable signal, with reference to the effect it has on the ability of the SDRAM to retrieve signals from the memory controller. By the same token, the method 1100 above could be modified to leave all SDRAM memory banks in an active mode until a signal from an enable/disable function directs that one of them be placed in an inactive mode.

The preceding description includes preferred examples for implementing the invention, set forth in order to make its practice and application clear to one of ordinary skill in the art. The scope of the invention, however, should not necessarily be limited by this description. Rather, the scope of the invention is defined by the following claims.

What is claimed is:

1. A memory module for a computer having a synchronous dynamic random access memory (SDRAM), said memory module comprising:
   a memory;
   a memory controller coupled for controlling memory access and refresh; and
   an in-line controller (ILC) coupled to respond to the occurrence of a memory-controller interruption event, for controlling memory refresh during the memory-controller interruption event instead of the control of memory refresh by the memory controller.

2. The memory module of claim 1, wherein the computer is a personal computer.

3. The memory module of claim 1, wherein the memory comprises a plurality of memory banks, and further comprising a plurality of in-line controllers, each in-line controller coupled for controlling memory refresh of at least one of the plurality of memory banks.

4. The memory module of claim 1, wherein the ILC is a separate physical component.

5. The memory module of claim 1, wherein the memory controller is formed in a semiconductor chip, and wherein the ILC is integrate into the same chip as the memory controller.

6. The memory module of claim 1, wherein the memory is formed in a semiconductor chip, and wherein the ILC is integrated into the same chip as the memory.

7. The memory module of claim 1, wherein the memory is a dual in-line memory module (DIMM) architecture memory.

8. The memory module of claim 1, wherein the memory module further includes a registered buffer.

9. The memory module of claim 8, wherein the ILC is formed with the registered buffer.

10. An in-line controller (ILC) for selectively controlling the refresh of an SDRAM, said ILC comprising:
    an ILC switch coupled between a memory controller and the SDRAM, wherein the memory controller controls the SDRAM refresh;
    a programmable logic device (PLD) coupled between the memory controller and the SDRAM, wherein the PLD controls the ILC switch such that an interrupting event producing a non-continuity in the function of the memory controller causes the PLD to activate the ILC switch and allow the PLD to control the SDRAM refresh until the interrupting event is finished.

11. The ILC of claim 10, wherein the PLD is a complex PLD (CPLD).

12. The ILC of claim 10, wherein the interrupting event is a reset of the memory controller.

13. The ILC of claim 12, wherein the reset is initiated by a reset signal to the memory controller that is also provided to the PLD.

14. The ILC of claim 13, wherein the reset signal is provided to the PLD prior to being provided to the memory controller so that the ILC switch may be activated before the reset occurs.

15. A method for independently controlling a memory device in a memory module including the memory device and a memory controller for controlling the memory device by providing control signals to a control bus between the memory controller and the memory device, the method comprising of the steps of:

providing an in-line controller (ILC) coupled for communicating control signals to the memory devices, wherein the ILC is coupled to receive at least one signal from which it can detect an interrupt event;

receiving the at least one signal in the ILC detecting an interrupt event;

preventing controls signals from the memory controller from being provided to the memory device; and     making available the memory device at least one ILC control signal.

16. The method of claim 15, wherein the ILC is also coupled to received at least one signal from which it can detect the end of an interrupt event, and further comprising the steps of:

detecting the end of an interrupt event;

terminating any ILC control signals; and permitting memory controller control signals.

17. The method of claim 15, wherein the memory device is an SDRAM.

18. The method of claim 17, wherein the interrupt event detected by the ILC is a memory-controller reset.

19. The method of claim 18, wherein the ILC control signal directs the SDRAM to enter low-power self-refresh mode.

20. The method of claim 15, wherein the memory module includes a plurality of memory banks, and the stop of providing an ILC includes providing a plurality of ILCs, each ILC for electively controlling at least one of the memory banks.

21. The method of claim 20, wherein the interrupt event is a signal to at least one ILC determining whether it allows control signals from the memory controller to be preserved to the memory device associated with the ILC.

22. The method of claim 21, wherein the interrupt event signal is provided so that at least one memory bank will be placed in an inactive state.

23. The method of claim 21, wherein the interrupt event signal is provided so that more than one memory bank location may be separately addressed with the same address.

24. The method of claim 21, wherein the memory module is associated with a system processor, and wherein the interrupt event signal is generated at the direction of the system processor.

* * * * *